(12) United States Patent
Milton

(10) Patent No.: US 7,863,949 B2
(45) Date of Patent: Jan. 4, 2011

(54) CIRCUIT AND DESIGN STRUCTURE FOR SYNCHRONIZING MULTIPLE DIGITAL SIGNALS

(75) Inventor: David W. Milton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/759,015

(22) Filed: Apr. 13, 2010

(65) Prior Publication Data

US 2010/0194459 A1     Aug. 5, 2010

Related U.S. Application Data

(62) Division of application No. 12/071,847, filed on Apr. 23, 2008, now Pat. No. 7,768,325.

(51) Int. Cl.
*H03L 7/00* (2006.01)
(52) U.S. Cl. ..................... 327/141; 327/145; 327/144
(58) Field of Classification Search .................... None
See application file for complete search history.

(56) References Cited

U.S. PATENT DOCUMENTS

| | | | |
|---|---|---|---|
| 5,278,873 A * | 1/1994 | Lowrey et al. ............ 375/371 |
| 6,031,396 A | 2/2000 | Hoshen et al. | |
| 6,163,584 A | 12/2000 | Weng et al. | |
| 6,172,540 B1 | 1/2001 | Gandhi | |
| 6,684,306 B1 | 1/2004 | Nagasawa et al. | |
| 6,782,499 B2 | 8/2004 | Osada et al. | |
| 6,822,478 B2 * | 11/2004 | Elappuparackal ............ 326/46 |
| 6,879,185 B2 * | 4/2005 | Swami et al. ............... 326/93 |
| 7,093,143 B2 | 8/2006 | Ito et al. | |
| 7,141,883 B2 | 11/2006 | Wei et al. | |
| 7,161,828 B2 | 1/2007 | Cummings et al. | |
| 2006/0071691 A1 | 4/2006 | Garlepp | |

OTHER PUBLICATIONS

David W. Milton, U.S. Appl. No. 12/107,847, Restriction Requirement, Feb. 1, 2010, 4 pages.
David W. Milton, U.S. Appl. No. 12/107,847, Notice of Allowance, Mar. 25, 2010, 3 pages.

* cited by examiner

*Primary Examiner*—Tuan Lam
(74) *Attorney, Agent, or Firm*—Gibb I.P. Law Firm, LLC; Richard M. Kotulak, Esq.

(57) ABSTRACT

Disclosed is a circuit configured to synchronize multiple signals received by one clock domain from a different asynchronous clock domain, when simultaneous movement of the signals between the clock domains is intended. In the circuit multiple essentially identical pipelined signal paths receive digital input signals. XOR gates are associated with each of the signal paths. Each XOR gate monitors activity in a given signal path and controls, directly or indirectly (depending upon the embodiment), advancement of signal processing in the other signal path(s) to ensure that, if warranted, output signals at the circuit output nodes are synchronized. In a two-signal path embodiment, advancement of signal processing in one signal path is triggered, whenever transitioning digital signals are detected within the other signal path. In an n-signal path advancement of signal processing is triggered in all signal paths, whenever transitioning digital signals are detected on at least one signal path.

20 Claims, 3 Drawing Sheets

CIRCUIT AND DESIGN STRUCTURE FOR SYNCHRONIZING MULTIPLE DIGITAL SIGNALS

CROSS-REFERENCE TO RELATED APPLICATIONS

This application is a Divisional of U.S. application Ser. No. 12/071,847 filed Apr. 23, 2008, now U.S. Pat. No. 7,768,325 the complete disclosure of which, in its entirety, is herein incorporated by reference.

BACKGROUND

1. Field of the Invention

The embodiments of the invention generally relate to synchronizing multiple incoming signals and, more particularly, to a circuit for synchronizing multiple incoming signals as well as to a design structure for such a circuit.

2. Description of the Related Art

Frequently, applications require simultaneous movement of multiple signals from a first clock domain to a different asynchronous second clock domain. That is, oftentimes applications require simultaneous launching of multiple signals by the first clock domain as well as simultaneous receipt of the multiple signals by the second clock domain. Unfortunately, the nature of flip/flop set-up and hold time variations between the clock domains can result in signals, which are intended to moved simultaneously between the first and second clock domains, actually arriving at different times in the second clock domain. Therefore, there is a need in the art for a circuit capable of synchronizing multiple input signals received by one clock domain from a different asynchronous clock domain, when simultaneous movement of the input signals between clock domains is intended.

SUMMARY OF THE INVENTION

In view of the foregoing, disclosed herein are embodiments of a circuit configured to synchronize multiple signals received by one clock domain from a different asynchronous clock domain, when simultaneous movement of the signals between the clock domains is intended. In the circuit multiple essentially identical pipelined signal paths receive digital input signals. XOR gates are associated with each of the signal paths. Each XOR gate monitors activity in a given signal path and controls, directly or indirectly (depending upon the embodiment), advancement of signal processing in the other signal path(s) to ensure that, if warranted, output signals at the circuit output nodes are synchronized. In a two-signal path embodiment, advancement of signal processing in one signal path is triggered, whenever transitioning digital signals are detected within the other signal path. In an n-signal path advancement of signal processing is triggered in all signal paths, whenever transitioning digital signals are detected.

In the two-signal path embodiment, the signal synchronization circuit comprises a first signal path and an essentially identical second signal path. The same clock signal clocks both signal paths. In each signal path an input node is adapted to receive a digital input signal from a different asynchronous clock domain. A first element (e.g., a flip-flop or latch) is electrically connected to the input node and adapted to receive the digital input signal applied to the input node. A second element (e.g., a flip-flop or latch) is electrically connected to the first element and adapted to receive a digital output signal from the first element. A multiplexor is electrically connected to both the first and second elements and is adapted to receive the digital output signals from these first and second elements. A third element (e.g., a flip-flop or latch) is electrically connected to the multiplexor and is adapted to receive the digital output signal from the multiplexor. Finally, an output node is electrically connected to the third element and is adapted to receive the digital output signal from the third element.

In addition to the two signal paths and clock signal, the signal synchronization circuit of this embodiment comprises two XOR gates. Specifically, a first XOR gate is adapted to receive the digital output signals from both the second and the third elements of the first signal path. Furthermore, the first XOR gate is electrically connected to the multiplexor in the second signal path such that the digital output signal from this first XOR gate controls the digital output signal from the multiplexor in the second signal path. Similarly, a second XOR gate is adapted to receive the digital output signals from both the second and the third elements of the second signal path. Furthermore, the second XOR gate is electrically connected to the multiplexor in the first signal path such that the digital output signal from this second XOR circuit controls the digital output signal from the multiplexor in the first signal path.

Specifically, the first XOR gate controls the multiplexor of the second signal path as follows. When the digital output signals from the second and third elements of the first signal path are received by the first XOR gate and determined to be different, the first XOR gate will cause the multiplexor in the second signal path to automatically pass the digital output signal from the first element of the second signal path directly to the third element of the second signal path. However, when the digital output signals from the second and third elements of the first signal path are the same, the first XOR gate will cause the multiplexor in the second signal path to pass the digital output signal from the second element of the second signal path to the third element of the first signal path. Similarly, the second XOR gate controls the multiplexor of the first signal path as follows. When the digital output signals from the second and third elements of the second signal path are different, the second XOR gate will cause the multiplexor in the first signal path to automatically pass the digital output signal from the first element of the first signal path directly to the third element of the first signal path. However, when the digital output signals from the second and third elements of the second signal path are the same, the second XOR gate will cause the multiplexor in the first signal path to pass the digital output signal from the second element of the first signal path to the third element of the first signal path.

Consequently, given the configuration of the first and second signal paths, the first XOR gate controls the multiplexor of the second signal path and the second XOR gate controls the multiplexor of the first signal path such that, when transitioning digital signals are sampled in the first element of the first signal path and in the first element of the second signal path, respectively, by a same clock edge or even by clock edges that are separated by up to one clock cycle, the output node of the first signal path and the output node of the second signal path will receive synchronized output signals. However, when transitioning digital signals are sampled in the first element of the first signal path and in the first element of the second signal path, respectively, by clock edges that are separated by more than two clock cycles, the first XOR gate will control the multiplexor of the second signal path and the second XOR gate will control the multiplexor of the first signal path such that the output node of the first signal path and the output node of the second signal path will receive unsynchronized output signals.

In the n-signal path embodiment, the signal synchronization circuit of the present invention is configured such that it can incorporate any number n of signal paths. Specifically, this embodiment of the circuit comprises multiple signal paths and a clock signal that clocks all of these signal paths. The multiple signal paths are essentially identical with each signal path comprising the same series of pipelined elements between an input node and an output node, as described above with regard to the first embodiment.

In addition to the multiple signal paths and clock signal, the signal synchronization circuit of this embodiment comprises multiple XOR gates and an OR gate electrically connected to each of the multiple XOR gates. Specifically, each XOR gate corresponds to one of the signals paths and is adapted to receive, from that one signal path, the digital output signals from the second and third elements. The OR gate is adapted to receive the digital output signals from all of the XOR gates. Furthermore, the OR gate is electrically connected to the multiplexor in each of the signal paths such that the digital output signal from the OR gate controls the digital output signal from the multiplexor in each of the signal paths.

Specifically, the OR gate controls the multiplexor in each of the signal paths as follows. When any digital output signal of any XOR gate is high, the OR gate will cause all of the multiplexors to automatically pass the digital output signal from the first element directly to the third element bypassing the second element in their corresponding signal paths. That is, if at least one XOR gate outputs a 1 to the OR gate, indicating that transitioning signals between the second and third elements in its signal path have been detected, then all signals in all paths will be advanced. However, when all output signals from all of the XOR gates are low, the OR gate will cause all of the multiplexors to pass the digital output signal from the second element to the third element of its corresponding signal path. That is, when no transitioning signals are detected in any of the signal paths between the second and third elements, the second element in each of the signal paths is not bypassed and no signals are advanced.

Consequently, given the configuration of the n-signal paths, the OR gate controls the multiplexor in each of the signal paths such that, when transitioning input signals are sampled in the first element of different signal paths by a same clock edge or by clock edges that are separated by only up to one clock cycle, the output nodes in all of the signal paths will receive synchronized output signals. However, when transitioning input signals are sampled in the first element of any of the signal paths by clock edges that are separated by more than two clock cycles, the OR gate controls the multiplexor in each of the signal paths such that, the output nodes in the signal paths will receive unsynchronized output signals.

Also disclosed herein are embodiments of design structures for the above-described circuits. The design structure embodiments can each be embodied in a machine readable medium, reside on storage medium as data format used for exchange of layout data of integrated circuits and comprise a netlist.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments without departing from the spirit thereof, and the embodiments include all such changes and modifications.

BRIEF DESCRIPTION OF THE DRAWINGS

The embodiments of the invention will be better understood from the following detailed description with reference to the drawings, in which.

DETAILED DESCRIPTION OF THE INVENTION

Figure 1:
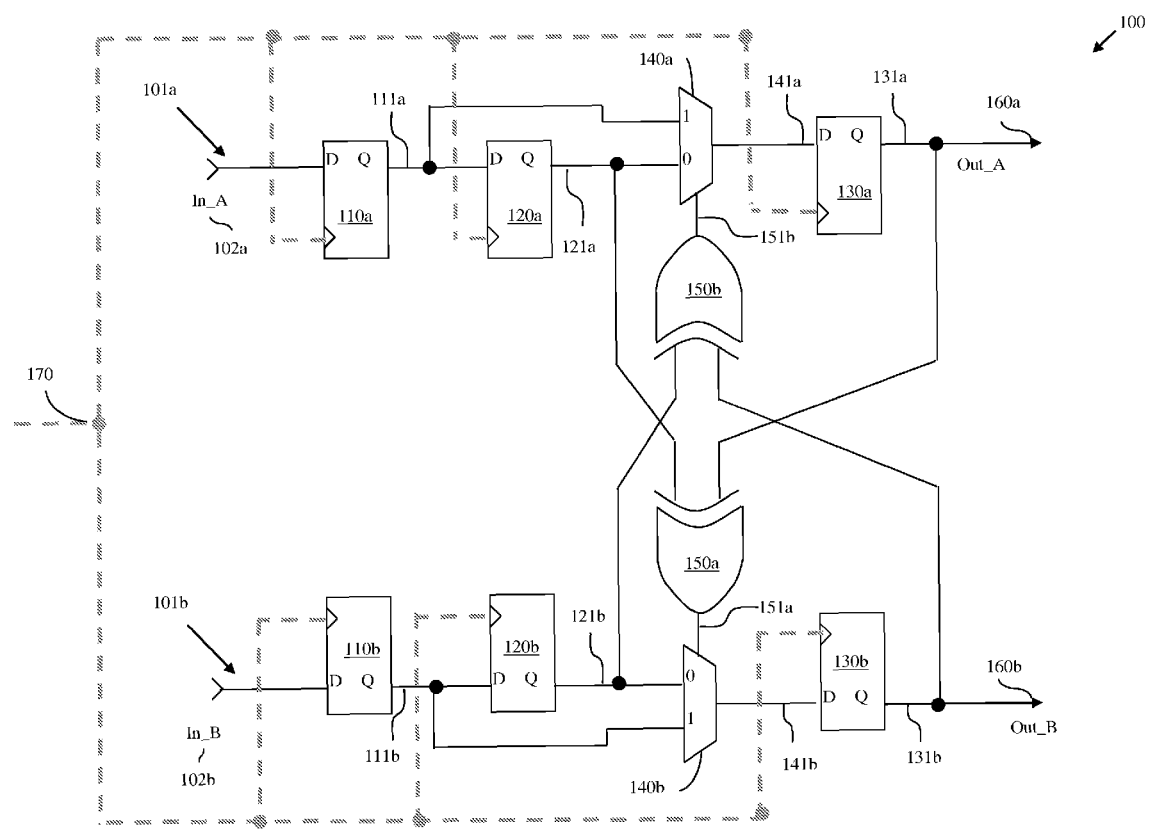
FIG. 1 is a schematic diagram illustrating one embodiment of the circuit of the present invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, applications can require simultaneous movement of multiple signals from a first clock domain to a different asynchronous second clock domain. That is, oftentimes applications require simultaneous launching of multiple signals by the first clock domain as well as simultaneous receipt of the multiple signals by the second clock domain. Unfortunately, due to the probabilistic nature of asynchronous crossing (i.e., due to the nature of flip/flop set-up and hold time variations between asynchronous clock domains) signals that are launched coincidentally by a first clock domain may arrive at a second clock domain at slightly different times (e.g., within a few pico-seconds of each other) such that the skew between them is less than a whole clock signal in the second clock domain. However, depending upon the timing of their arrival, the slightly skewed signals may be sampled in the second clock domain by different clock edges, thereby increasing the skew between the signals to a full clock cycle. One known technique for solving this problem is to add additional wires to the domain crossing path and to implement a full handshake. Another known technique for solving this problem is to implement a full first-in first-out (FIFO) circuit. Both of these techniques require additional hardware and inevitably result in latency overhead. Therefore, there is a need in the art for an improved technique for synchronizing multiple incoming clock signals, when simultaneous movement between clock domains is intended.

In view of the foregoing, disclosed herein are embodiments of a circuit configured to synchronize multiple signals received by one clock domain from a different asynchronous clock domain, when simultaneous movement of the signals between the clock domains is intended. In the circuit multiple essentially identical pipelined signal paths receive digital input signals. XOR gates are associated with each of the signal paths. Each XOR gate monitors activity in a given signal path and controls, directly or indirectly (depending upon the embodiment), advancement of signal processing in the other signal path(s) to ensure that, if warranted, output signals at the circuit output nodes are synchronized. In a two-signal path embodiment, advancement of signal processing in one signal path is triggered, whenever transitioning digital signals are detected within the other signal path. In an n-signal path advancement of signal processing is triggered in all signal paths, whenever transitioning digital signals are detected at least one signal path.

Referring to FIG. 1, a two-signal path embodiment of the signal synchronization circuit 100 of the present invention comprises a first signal path 101a and a second signal path 101b. The first and second signal paths 101a, 101b are essentially identical (i.e., substantially similar, based on a same design, etc.). The same clock signal 170 clocks both the first and second signal paths 101a, 101b. The first and second signal paths 101a, 101b are essentially identical with each signal path 101a, 101b comprising a series of pipelined elements between an input node and an output node.

Specifically, in each signal path 101a, 101b an input node is adapted to receive a discrete digital input signal 102a, 102b from a different asynchronous clock domain (i.e., from a first clock domain). A first element 110a, 110b (e.g., a flip-flop or latch) is electrically connected to the input node and is adapted to receive the digital input signal 102a, 102b applied to the input node. A second element 120a, 120b (e.g., a flip-flop or latch) is electrically connected to the first element 110a, 110b and is adapted to receive a digital output signal 111a, 111b from the first element 110a, 110b. A multiplexor 140a, 140b is electrically connected to both the first element 110a, 110b and the second element 120a, 120b and is adapted to receive the digital output signal 111a, 111b from the first element 110a, 110b and to further receive the digital output signal 121a, 121b from the second element 120a, 120b. A third element 130a, 130b (e.g., a flip-flop or latch) is electrically connected to the multiplexor 140a, 140b and is adapted to that receive the digital output signal 141a, 141b from the multiplexor 140a, 140b. Finally, an output node 160a, 160b (e.g., an output node to a second clock signal domain) is electrically connected to the third element 130a, 130b and is adapted to receive the digital output signal 131a, 131b from the third element 130a, 130b.

In addition to the two signal paths 101a, 101b and clock signal 170, the signal synchronization circuit 100 of this embodiment comprises two XOR gates 150a, 150b. Specifically, a first XOR gate 150a is adapted to receive the digital output signals 121a and 131a from both the second element 120a and the third element 130a of the first signal path 101a. Furthermore, the first XOR gate 150a is electrically connected to the multiplexor 140b in the second signal path 101b such that the digital output signal 151a from this first XOR gate 150a controls the digital output signal 141b from that multiplexor 140b. Similarly, a second XOR gate 150b is adapted to receive the digital output signals 121b and 131b from both the second element 120b and the third element 130b of the second signal path 101b. Furthermore, the second XOR gate 150b is electrically connected to the multiplexor 140a in the first signal path 101a such that the digital output signal 151b from this second XOR circuit 150b controls the digital output signal 141a from that multiplexor 140a.

As mentioned above, due to the probabilistic nature of asynchronous crossing (i.e., due to the nature of flip/flop set-up and hold time variations between asynchronous clock domains), multiple signals that are launched coincidentally by a first clock domain may arrive at a second clock domain at slightly different times (e.g., within a few pico-seconds of each other) such that the skew between the arriving signals is less than a whole clock signal in the second clock domain. However, depending upon the timing of their arrival, the slightly skewed signals may be sampled in the second clock domain by different clock edges, thereby increasing the skew between the signals to a full clock cycle. The two-signal path circuit 100 of the present invention solves this problem by monitoring the arrival of events on the two signals paths 101a and 101b and, if it sees an event on one signal path (e.g., path 101a) arrive before an event on the other signal path (e.g., 101b), it advances the lagging signal by one clock cycle. Thus, when there is up to a full clock cycle of skew between the two signals 102a and 102b, that skew is removed. This means that, regardless of the slight skew in the arrival of the signals, the two events will arrive at the output nodes 160a and 160b coincidentally.

Specifically, the first XOR gate 150a controls the multiplexor 140b of the second signal path 101b as follows. When the digital output signals 121a, 131a from the second and third elements 120a, 130a of the first signal path 101a are received by the first XOR gate 150a and determined to be different (e.g., a 1 and a 0 or a 0 and a 1, respectively), the first XOR gate 150a will cause the multiplexor 140b in the second signal path 101b to automatically pass the digital output signal 111b from the first element 110b of the second signal path 101b directly to the third element 130b of the second signal path 101b. That is, whenever transitioning digital signals (e.g., 1 to 0 or 0 to 1) are detected in the first signal path 101a between the first and third elements 110a and 130a, the second element 120b of the second signal path 101b will be bypassed advancing the signal in the second signal path 101b by one full clock cycle. However, when the digital output signals 121a, 131a from the second and third elements 120a, 130a of the first signal path 101a are the same (e.g., a 1 and a 1 or a 0 and a 0, respectively), the first XOR gate 150a will cause the multiplexor 140b in the second signal path 101b to pass the digital output signal 121b from the second element 120b of the second signal path 101b to the third element 130b of the second signal path 101b. That is, whenever non-transitioning digital signals (e.g., 0 to 0 or 1 to 1) are detected by the first XOR gate 150a in the first signal path 101a, the second element 120b in the second signal path 101b is not bypassed and the signal in the second signal path 101b is not advanced.

Similarly, the second XOR gate 150b controls the multiplexor 140a of the first signal path 101a as follows. When the digital output signals 121b, 131b from the second and third elements 120b, 130b of the second signal path 101b are different (e.g., a 1 and a 0 or a 0 and a 1, respectively), the second XOR gate 150b will cause the multiplexor 140a in the first signal path 101a to automatically pass the digital output signal 111a from the first element 110a of the first signal path 101a directly to the third element 130a of the first signal path 101a. That is, whenever transitioning digital signals (e.g., 1 to 0 or 0 to 1) are detected in the second signal path 101b between the first and third elements 110b and 130b, the second element 120a of the first signal path 101a will be bypassed advancing the signal in the first signal path 101a by one full clock cycle. However, when the digital output signals 121b, 131b from the second and third elements 110b, 130b of the second signal path 101b are the same (e.g., a 1 and a 1 or a 0 and a 0, respectively), the second XOR gate 150b will cause the multiplexor 140a in the first signal path 101a to pass the digital output signal 121a from the second element 120a of the first signal path 101a to the third element 130a of the first signal path 101a. That is, whenever non-transitioning digital signals (e.g., 0 to 0 or 1 to 1) are detected by the second XOR gate 150b in the second signal path 101b, the second element 120a in the first signal path 101a is not bypassed and the signal in the second signal path 101a is not advanced.

Consequently, given the configuration of the first and second signal paths 101a, 101b, the first XOR gate 150a controls the multiplexor 140b of the second signal path 101b and the second XOR gate 150b controls the multiplexor 140a of the first signal path 101a such that, when transitioning digital signals are sampled in the first element 110a of the first signal path 101a and in the first element 110b of the second signal path 101b, respectively, by a same clock edge, the output node 160a of the first signal path 101a and the output node 160b of the second signal path 101b will receive synchronized output signals 131a, 131b from the third elements 130a, 130b. In this case, because the transitioning digital signals are sampled by the same clock edge, they will simultaneously be detected by the XOR gates 150a, 150b. The XOR gates 150a, 150 will cause the multiplexors 140a, 140b to advance the signals in each signal path 101a, 101b essentially simultaneously by one full clock cycle by bypassing the second elements 120a, 120b. Thus, the input signals 102a and 102b, which were initially synchronized because they were sampled by the same clock edge, will remain synchronized as output signals 131a, 131b from the third elements 130a, 130b arriving at the output nodes 160a, 160b.

Furthermore, when transitioning digital signals are sampled in the first element 110a of the first signal path 101a and in the first element 110b of the second signal path 101b, respectively, by clock edges that are separated by up to one clock cycle, the first and second XOR gates 150a, 150b will also control the second and first multiplexors 140b, 140a, respectively, such that the output node 160a of the first signal path 101a and the output node 160b of the second signal path 101b receive synchronized output signals 131a, 131b from the third elements 130a, 130b. In this case, the first and second signal paths 101a and 101b are configured to ensure that signals, which were intended to be synchronized upon arrival at the second clock domain, as indicated by the slight skew, are in fact synchronized. That is, when input signals 102a and 102b are only slightly skewed, the lagging signal will be advanced by one full clock signal (i.e., the second element in the signal path of the lagging signal will be bypassed). Thus, the input signals 102a and 102b, which are initially slightly skewed and sampled by different but close in time clock edges, will become synchronized as output signals 131a, 131b from the third elements 130a, 130b arriving at the output nodes 160a, 160b. The symmetric nature of the circuit 100 design ensures synchronized output signals, when there is no skew or when skew is only slight (i.e., within one clock cycle) regardless of which signal 102a or 102b is sampled first.

However, where the skew between input signals 102a, 102b is greater than a predetermined time so as to clearly indicate that synchronization was not intended, the XOR gates 150a, 150b will not cause signal advancement. That is, when transitioning digital signals are sampled in the first element 110a of the first signal path 101a and in the first element 110b of the second signal path 101b, respectively, by clock edges that are separated by more than two clock cycles, the first XOR gate 150a will control the multiplexor 140b of the second signal path 101b and the second XOR gate 150b will control the multiplexor 140a of the first signal path 101a such that the output node 160a of the first signal path 101a and the output node 160b of the second signal path 101b will receive unsynchronized output signals 131a, 131b from the third elements 130a, 130b. That is, when input signals 102a and 102b are significantly skewed, the lagging signal will not be advanced by one full clock signal (i.e., the second element in the signal path of the lagging signal will not be bypassed). Thus, the input signals 102a and 102b, which are skewed and sampled by clock edges separated by more than two clock cycles, will remain unsynchronized as output signals 131a, 131b and will arrive at the output nodes 160a, 160b in the sequence in which they were launched by the first clock domain.

It should be noted that for the circuit 100 to operate, as discussed in detail above, the digital input signals 102a and 102b must change (i.e., transition from 1 to 0 or from 0 to 1) less frequently than one-half the frequency of the destination clock 170.

Figure 2:
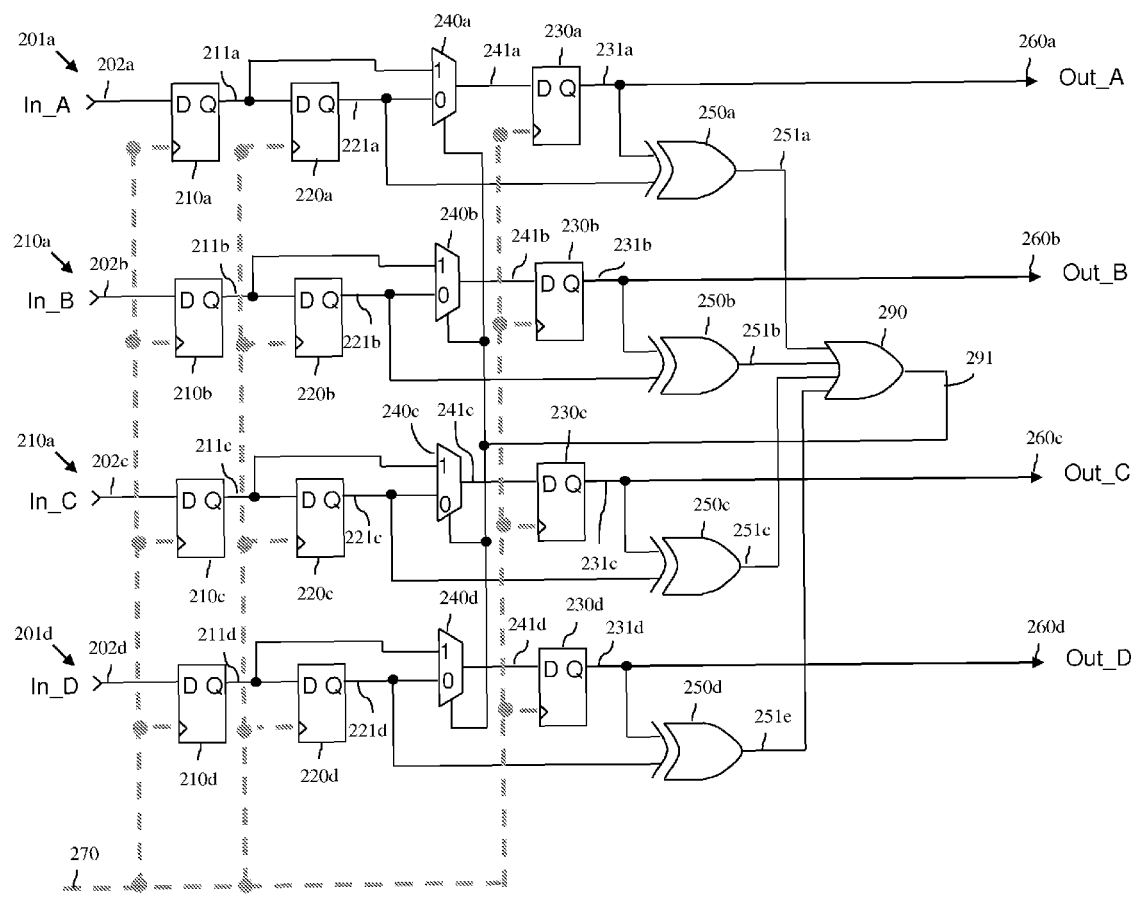
FIG. 2 is a schematic diagram illustrating another embodiment of the circuit of the present invention.

Referring to FIG. 2, the n-signal path embodiment of the signal synchronization circuit 200 of the present invention operates in essentially the same manner as the above-described circuit 100 embodiment, but is configured such that it can incorporate any number n of signal paths, as opposed to just two. Specifically, this embodiment of the circuit 200 comprises multiple signal paths 201a, 201b, 201c, 201d and a clock signal 270 that clocks all of these signal paths 201a, 201b, 201c, 201d. For illustration purposes, FIG. 2 shows four signal paths 201a, 201b, 201c, 201d; however, it is anticipated that the circuit 200 of FIG. 2 can incorporate as few as two signal paths up to an unlimited number of signal paths. The multiple signal paths 201a, 201b, 201c, 201d are essentially identical (i.e., substantially similar, based on a same design, etc.) with each signal path comprising a series of pipelined elements between an input node and an output node.

Specifically, as with the previously described embodiment, in each signal path 201a, 201b, 201c, 201d an input node is adapted to receive a discrete digital input signal 202a, 202b, 202c, 202d from a different asynchronous clock domain (i.e., from a first clock domain). A first element 210a, 210b, 210c, 210d (e.g., a flip-flop or latch) is electrically connected to the input node and is adapted to receive the digital input signal 202a, 202b, 202c, 202d applied to the input node. A second element 220a, 220b, 210c, 220d (e.g., a flip-flop or latch) is electrically connected to the first element 210a, 210b, 210c, 210d and is adapted to receive a digital output signal 211a, 211b, 211c, 211d from the first element 210a, 210b, 210c, 210d. A multiplexor 240a, 240b, 240c, 240d is electrically connected to both the first element 210a, 210b, 210c, 210d and the second element 220a, 220b, 220c, 220d and is adapted to receive the digital output signal 211a, 211b, 211c, 211d from the first element 210a, 210b, 210c, 210d and to further receive the digital output signal 221a, 221b, 221c, 221d from the second element 220a, 220b, 220c, 220d. A third element 230a, 230b, 230c, 230d (e.g., a flip-flop or latch) is electrically connected to the multiplexor 240a, 240b, 240c, 240d and is adapted to receive the digital output signal 241a, 241b, 241c, 241d from the multiplexor 240a, 240b, 240c, 240d. Finally, an output node 260a, 260b, 260c, 260d (e.g., an output node to a second clock domain) is electrically connected to the third element 230a, 230b, 230c, 230d and is adapted to receive the digital output signal 231a, 231b, 231c, 231d from the third element 230a, 230b, 230c, 230d.

In addition to the multiple signal paths 201a, 210b, 210c, 201d and clock signal 270, the signal synchronization circuit 200 of this embodiment comprises multiple XOR gates 250a, 250b, 250c, 250d and an OR gate 290 electrically connected to each of the multiple XOR gates 250a, 250b, 250c, 250d. Specifically, each XOR gate 250a, 250b, 250c, 250d corresponds to one of the signals paths 201a, 201b, 201c, 201d and is adapted to receive, from that one signal path, the digital output signal 221a, 221b, 221c, 221d from the second element 220a, 220b, 220c, 220d and the digital output signal 231a, 231b, 231c, 231d from the third element 230a, 230b, 230c, 230d. The OR gate 290 is adapted to receive the digital output signals 251a, 251b, 251c, 251d from all of the XOR gates 250a, 250b, 250c, 250d. Furthermore, the OR gate 290 is electrically connected to the multiplexor 240a, 240b, 240c, 240d in each of the signal paths 201a, 201b, 201c, 201d such that the digital output signal 291 from the OR gate 290 controls the digital output signal 241a, 241b, 241c, 241d from the multiplexor 240a, 240b, 240c, 240d in each of the signal paths 201a, 201b, 201c, 201d.

As mentioned above, due to the probabilistic nature of asynchronous crossing (i.e., due to the nature of flip/flop set-up and hold time variations between asynchronous clock domains), multiple signals that are launched coincidentally by a first clock domain may arrive at a second clock domain at slightly different times (e.g., within a few pico-seconds of each other) such that the skew between them is less than a whole clock signal in the second clock domain. However, depending upon the timing of their arrival, the slightly skewed signals may be sampled in the second clock domain by different clock edges, thereby increasing the skew between the signals to a full clock cycle. The circuit 200 of the present invention solves this problem by monitoring the arrival of events on multiple signals paths 201a, 201b, 201c, 201d and, if it sees an event on one signal path (e.g., path 201a) arrive, it advances all of the signals by one clock cycle. Thus, when there is up to a full clock cycle of skew between any two signals (e.g., 202a and 202b), that skew is removed. This means that, regardless of the slight skew in the arrival of the signals, all events will arrive at the output nodes 260a, 260b, 260c, 260d coincidentally.

Specifically, the OR gate 290 controls the multiplexor 240a, 240b, 240c, 240d in each of the signal paths 201a, 201b, 201c, 201d as follows. When any digital output signal (e.g., 251a, 251b, 251c or 251d) of any XOR gate 250a, 250b, 250c or 250d is high, the OR gate 290 will cause all of the multiplexors 240a, 240b, 240c and 240d (i.e., the multiplexor in each of the signal paths 201a, 201b, 201c, 201d) to automatically pass the digital output signal 211a, 211b, 201c, 211d, respectively, from the first element 210a, 210b, 210c, 210d directly to the third element 230a, 230b, 230c, 230d bypassing the second element 220a, 220b, 220c, 220d in their corresponding signal paths 230a, 230b, 230c, 230d. That is, if at least one XOR gate (e.g., XOR gate 250a) outputs a 1 to the OR gate 290, indicating that transitioning signals (e.g., 1 and 0 or 0 and 1) between the second and third elements in its signal path (e.g., between elements 220a and 220b of signal path 201a) have been detected, then all signals in all paths 201a, 201b, 201c and 201d will be advanced one full clock cycle by bypassing the second elements 220a, 220b, 220c and 230d. Advancement of all signals in this case ensures that any digital input signals (e.g., 202a and 202b), which were initially synchronized because they were sampled by the same clock edge, will remain synchronized as output signals 231a and 231b, respectively, arriving at the output nodes 260a and 260b. Advancement of all signals in this case further ensures that any input signals (e.g., 202a and 202b), which are initially slightly skewed and sampled by different but close in time clock edges, will become synchronized as output signals 231a and 231c arriving at the output nodes 260a and 260b. However, when all output signals 251a, 251b, 251c, and 251d from all of the XOR gates 250a, 250b, 250c and 250d are low, the OR gate 290 will cause all of the multiplexors 240a, 240b, 240c and 240d (i.e., the multiplexor in each of the signal paths 201a, 201b, 201c and 201d) to pass the digital output signal 221a, 221b, 221c and 221d from the second element 220a, 220b, 220c and 230d to the third element 230a, 230b, 230c and 230d of its corresponding signal path 201a, 201b, 201c and 201d. That is, when no transitioning signals are detected in the signal paths 201a, 201b, 201c and 201d between the second elements 220a, 220b, 220c and 220d and the third elements 230a, 230b, 230c and 230, respectively, the second element 220a, 220b, 220c, 220d in each of the signal paths 201a, 201b, 201c, 201d is not bypassed and no signals are advanced.

Consequently, given the configuration of the n-signal paths, the OR gate 290 controls all the multiplexors 240a, 240b, 240c and 240d (i.e., the multiplexor in each of the signal paths 201a, 201b, 201c and 201d) such that, when transitioning input signals are sampled in the first element 210a, 210b, 210c, 210d of different signal paths 201a, 201b, 201c, 201d by a same clock edge or by clock edges that are separated by only up to one clock cycle, the output nodes 260a, 260b, 260c and 260d in all of the signal paths 201a, 201b, 201c and 201d will receive synchronized output signals 231a, 231b, 231c, 231d from the third elements 230a, 230b, 230c and 230d. The circuit 200 design ensures synchronized output signals, when skew is only slight (i.e., within one clock cycle) regardless of which signal 202a, 202b, 202c or 202d is sampled first.

However, when transitioning input signals (e.g., 202a and 202b) are sampled in the first element (e.g., 210a and 210b) of any of the signal paths (e.g., 201a and 201b) by clock edges that are separated by more than two clock cycles, the OR gate 290 controls the multiplexor 240a, 240b, 240c, 240d in each of the signal paths 201a, 201b, 201c and 201d such that, the output nodes 260a, 260b, 260c and 260d in the signal paths 201a, 201b, 201c and 201d will receive unsynchronized output signals (e.g., 231a and 231b). That is, the signals 231a, 231b, 231c, 231d will be received from the third elements 230a, 230b, 230c, 230d at the output nodes 260a, 260b, 260c, 260d in the sequence in which they were sent.

It should be noted that for the circuit 200 to operate, as discussed in detail above, the digital input signals 202a, 202b, 202c or 202d must change (i.e., transition from 1 to 0 or from 0 to 1) less frequently than one-half the frequency of the destination clock 270.

Figure 3:
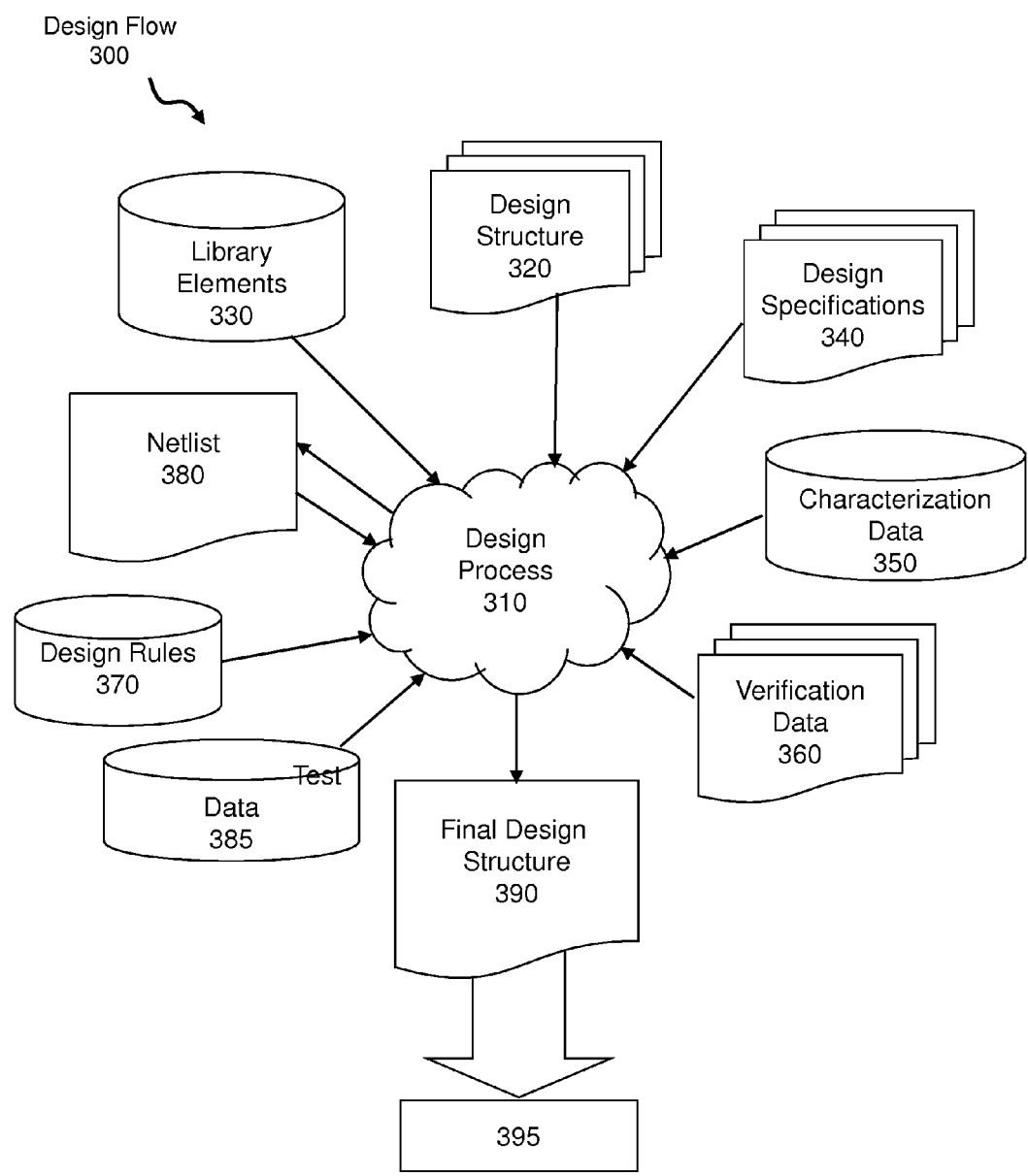
FIG. 3 is a flow diagram of a design process used in semiconductor design, manufacture, and/or test.

Also disclosed herein are embodiments of design structures for the above-described circuits. The design structures can the design structure embodiments can each be embodied in a machine readable medium, reside on storage medium as data format used for exchange of layout data of integrated circuits and comprise a netlist. More specifically, FIG. 3 shows a block diagram of an exemplary design flow 300 used for example, in semiconductor design, manufacturing, and/or test. Design flow 300 may vary depending on the type of IC being designed. For example, a design flow 300 for building an application specific IC (ASIC) may differ from a design flow 300 for designing a standard component. Design structure 320 is preferably an input to a design process 310 and may come from an IP provider, a core developer, or other design company or may be generated by the operator of the design flow, or from other sources. Design structure 320 comprises an embodiment of the invention as shown in FIGS. 1 and 2 in the form of schematics or HDL, a hardware-description language (e.g., Verilog, VHDL, C, etc.). Design structure 320 may be contained on one or more machine readable medium. For example, design structure 320 may be a text file or a graphical representation of an embodiment of the invention as shown in FIGS. 1 and 2. Design process 310 preferably synthesizes (or translates) an embodiment of the invention as shown in FIGS. 1 and 2 into a netlist 380, where netlist 380 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 380 is resynthesized one or more times depending on design specifications and parameters for the circuit.

Design process 310 may include using a variety of inputs; for example, inputs from library elements 330 which may house a set of commonly used elements, circuits, and devices, including models, layouts, and symbolic representations, for a given manufacturing technology (e.g., different technology nodes, 32 nm, 45 nm, 90 nm, etc.), design specifications 340, characterization data 350, verification data 360, design rules 370, and test data files 385 (which may include test patterns and other testing information). Design process 310 may further include, for example, standard circuit design processes such as timing analysis, verification, design rule checking, place and route operations, etc. One of ordinary skill in the art of integrated circuit design can appreciate the extent of possible electronic design automation tools and applications used in design process 310 without deviating from the scope and spirit of the invention. The design structure of the invention is not limited to any specific design flow.

Design process 310 preferably translates an embodiment of the invention as shown in FIGS. 1 and 2, along with any additional integrated circuit design or data (if applicable), into a second design structure 390. Design structure 390 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 390 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1 and 2. Design structure 390 may then proceed to a stage 395 where, for example, design structure 390: proceeds to tape-out, is released to manufacturing, is released to a mask house, is sent to another design house, is sent back to the customer, etc.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that the embodiments can be practiced with modification within the spirit and scope of the appended claims.

What is claimed is:

1. A signal synchronization circuit comprising:
multiple signal paths, wherein each of said signal paths comprises:
an input node;
a first element that receives an input signal applied to said input node;
a second element that receives an output signal from said first element;
a multiplexor that receives said output signal from said first element and that further receives an output signal from said second element;
a third element that receives an output signal from said multiplexor; and
an output node that receives an output signal from said third element;
multiple XOR gates, wherein each XOR gate corresponds to one of said signals paths, receives said output signal from said second element of said one of said signal paths and further receives said output signal from said third element of said one of said signal path; and
an OR gate that receives output signals from all of said XOR gates, wherein an output signal from said OR gate controls said output signal from said multiplexor in each of said signal paths.

2. The signal synchronization circuit according to claim 1, further comprising a clock signal that clocks all of said signal paths.

3. The signal synchronization circuit according to claim 1, wherein said OR gate controls said multiplexor in each of said signal paths as follows:
when any output signal of any XOR gate is high, said multiplexor in each of said signal paths will pass said output signal from said first element directly to said third element bypassing said second element, and
when all output signals from all of said XOR gates are low, said multiplexor in each of said signal paths will pass said output signal from said second element to said third element.

4. The signal synchronization circuit according to claim 1, wherein said OR gate controls said multiplexor in each of said signal paths such that, when transitioning signals are sampled in said first element of different signal paths by clock edges that are separated by only up to one clock cycle, the output nodes in all of said signal paths will receive synchronized output signals.

5. The signal synchronization circuit according to claim 1, wherein said OR gate controls said multiplexor in each of said signal paths such that, when transitioning signals are sampled in said first element of all of said signal paths by a same clock edge, the output nodes in all of said signal paths will receive synchronized output signals.

6. The signal synchronization circuit according to claim 1, wherein said OR gate controls said multiplexor in each of said signal paths such that, when transitioning signals are sampled in said first element of any of said signal paths by clock edges that are separated by more than two clock cycles, the output nodes in said signal paths will receive unsynchronized output signals.

7. The signal synchronization circuit according to claim 1, wherein said first element, said second element and said third element each comprise one of a latch and a flip-flop.

8. A design structure embodied in a machine readable medium, said design structure comprising a signal synchronization circuit, said circuit comprising:
multiple signal paths, wherein each of said signal paths comprises:
an input node;
a first element that receives an input signal applied to said input node;
a second element that receives an output signal from said first element;

a multiplexor that receives said output signal from said first element and that further receives an output signal from said second element;

a third element that receives an output signal from said multiplexor; and an output node that receives an output signal from said third element;

multiple XOR gates, wherein each XOR gate corresponds to one of said signals paths, receives said output signal from said second element of said one of said signal paths and further receives said output signal from said third element of said one of said signal path; and an OR gate that receives output signals from all of said XOR gates, wherein an output signal from said OR gate controls said output signal from said multiplexor in each of said signal paths.

9. The design structure, according to claim 8, wherein said design structure comprises a net list.

10. The design structure, according to claim 8, wherein said design structure resides on storage medium as data format used for exchange of layout data of integrated circuits.

11. The design structure according to claim 8, further comprising a clock signal that clocks all of said signal paths.

12. The design structure according to claim 8, wherein said OR gate controls said multiplexor in each of said signal paths as follows:

when any output signal of any XOR gate is high, said multiplexor in each of said signal paths will pass said output signal from said first element directly to said third element bypassing said second element, and when all output signals from all of said XOR gates are low, said multiplexor in each of said signal paths will pass said output signal from said second element to said third element.

13. The design structure according to claim 8, wherein said OR gate controls said multiplexor in each of said signal paths such that, when transitioning signals are sampled in said first element of different signal paths by clock edges that are separated by only up to one clock cycle, the output nodes in all of said signal paths will receive synchronized output signals.

14. The design structure according to claim 8, wherein said OR gate controls said multiplexor in each of said signal paths such that, when transitioning signals are sampled in said first element of all of said signal paths by a same clock edge, the output nodes in all of said signal paths will receive synchronized output signals.

15. The design structure according to claim 8, wherein said OR gate controls said multiplexor in each of said signal paths such that, when transitioning signals are sampled in said first element of any of said signal paths by clock edges that are separated by more than two clock cycles, the output nodes in said signal paths will receive unsynchronized output signals.

16. The design structure according to claim 8, wherein said first element, said second element and said third element each comprise one of a latch and a flip-flop.

17. A signal synchronization circuit comprising:

multiple signal paths, wherein each of said signal paths comprises:

an input node;

a first element that receives an input signal applied to said input node;

a second element that receives an output signal from said first element;

a multiplexor that receives said output signal from said first element and that further receives an output signal from said second element;

a third element that receives an output signal from said multiplexor; and an output node that receives an output signal from said third element; and multiple XOR gates, wherein each XOR gate corresponds to one of said signals paths, receives said output signal from said second element of said one of said signal paths and further receives said output signal from said third element of said one of said signal path.

18. The signal synchronization circuit according to claim 17, further comprising a clock signal that clocks all of said signal paths.

19. The signal synchronization circuit according to claim 17, wherein said first element, said second element and said third element each comprise one of a latch and a flip-flop.

20. The signal synchronization circuit according to claim 17, wherein said OR gate that receives output signals from all of said XOR gates, wherein an output signal from said OR gate controls said output signal from said multiplexor in each of said signal paths.

* * * * *